United States Patent [19]
Ma

[11] Patent Number: 5,441,150
[45] Date of Patent: Aug. 15, 1995

[54] MEMORY MODULE CONTAINER

[75] Inventor: Abraham C. Ma, Union City, Calif.

[73] Assignee: Ma Laboratories, Inc., San Jose, Calif.

[21] Appl. No.: 268,665

[22] Filed: Jun. 29, 1994

Related U.S. Application Data

[63] Continuation of Ser. No. 939,988, Sep. 3, 1992, abandoned.

[51] Int. Cl.⁶ .............................................. B65D 73/02
[52] U.S. Cl. ................................... 206/707; 206/485; 206/521; 206/587; 206/709; 220/533; 220/306; 220/339; 220/671; 220/675
[58] Field of Search ................. 220/4.21, 4.22, 4.23, 220/533, 339, 306, 669, 671, 675; 206/328, 329, 334, 428, 455, 456, 485, 521, 521.7, 583, 587, 45.14

[56] References Cited

U.S. PATENT DOCUMENTS

| | | | |
|---|---|---|---|
| 3,554,429 | 1/1971 | Cohen | 206/456 X |
| 3,710,975 | 1/1973 | Jansen | 220/339 |
| 4,681,223 | 7/1987 | Roberts | 206/354 |
| 4,687,129 | 8/1987 | Cugley | 220/339 X |
| 4,753,351 | 6/1988 | Guillin | 206/520 |
| 4,754,896 | 7/1988 | Roltgen et al. | 220/339 |
| 4,901,884 | 2/1990 | Kallenbach | 220/339 |
| 5,025,924 | 6/1991 | Watanabe | 206/334 |
| 5,046,659 | 9/1991 | Warburton | 229/2.5 |

FOREIGN PATENT DOCUMENTS

1093869 12/1967 United Kingdom ................ 206/456

Primary Examiner—Allan N. Shoap
Assistant Examiner—Stephen Cronin
Attorney, Agent, or Firm—Lyon & Lyon

[57] ABSTRACT

A container for memory modules comprising a generally rectangular shape with a lid and tray with a multitude of finger-like protrusions forming vertical slots therebetween for receiving memory modules. The interior is formed such that a cavity may be created above and below the memory modules contained inside providing a buffer region, which protects the contents from damage when the exterior of the container is subjected to physical contact.

5 Claims, 6 Drawing Sheets

MEMORY MODULE CONTAINER

This is a continuation of application Ser. No. 07/939,988 filed on Sep. 3, 1992, now abandoned.

BACKGROUND OF THE INVENTION a. Field of the Invention

The field of the invention pertains to memory module containers, more specifically, memory module packaging for SIMMs and SIPPs.

b. Background Art

Memory modules are generally composed of integrated circuits mounted on printed circuit boards of various shapes. These modules, although fairly durable, may be damaged by electrostatic discharge or excessive physical impact. Antistatic plastic bags and cardboard boxes are among the containers currently being used for storing and handling memory modules.

One disadvantage of these types of containers is the difficulty in performing a final inspection. The bags are difficult to see through because they are typically constructed from opaque or nearly opaque antistatic plastic, and the cardboard boxes are impossible to see through. Therefore, when these types of containers are used, it is laborious, if not impossible, to visually check the container's contents or to determine how many modules are stored therein. To perform an inspection of the contents, therefore, it is usually necessary to open these containers. Since the modules may be destroyed by an electrostatic discharge, any inspection of the contents of these containers is generally done in an electrostatically safe environment. Additionally, the plastic bags are often held closed by a paper warning label or a label indicating the contents of the bag. Opening one of these bags for inspection will destroy the label, requiring the application of a new label. Furthermore, since the bags generally have one opening at their end, depending on the inspection being performed, the inspector may have to dump out all of the modules. While the cardboard boxes may not be damaged by opening and closing, they are often difficult to open and close and must also usually be opened in an electrostatic-free environment.

Another disadvantage of the plastic bags is the lack of protection from physical damage. The protection from physical damage furnished by the uncushioned, thin-walled, flexible plastic bags is minimal. Modules stored in one of these bags are therefore subject to damage from external physical shocks. Further, because of their construction, the bags do not restrain the modules from independent movement. The modules can abrade against each other, causing physical damage from internal movement of the module. Therefore, it is particularly undesirable to package a large quantity of modules in a single storage bag.

Another reason large quantities of modules are not stored in a single bag is that, the higher the number of modules, the more difficult it is to ascertain how many are contained in a storage bag without opening it. It is also impracticable to include more than one type of module in a single bag because it is difficult to verify that the bag contains more than one type of module and to verify the quantity of each type included.

Since each plastic bag generally contains a relatively small number of modules, a large number of bags is required, resulting in increased packaging costs. The cost for packaging the modules in bags is also high because, as the number of packages increases, so do the labor charges to package the modules. Each bag must be opened, closed, sealed, and labeled. Costs are further increased because, depending on how they were closed, the bags are ripped open by the purchaser, preventing reuse.

Another disadvantage of the plastic bags centers around the problems of maintaining an inventory of the as yet unfilled bags. Being flexible, the bags are difficult to stack. Even after they are filled, since their exterior shape is defined to a large extent by their contents, they remain difficult to stack.

Cardboard box containers afford more physical protection for the modules than do the plastic bags. However, these boxes are typically lined with antistatic foam or bubble packing to stabilize, confine, and cushion the modules. Due to this packaging, the boxes are large and bulky, trading larger size for enhanced protection. Much like the plastic bags, the cardboard-box type containers are labor intensive to pack. The more difficult the packing, the longer it takes and the more it costs.

SUMMARY OF THE INVENTION

The instant invention comprises a memory module container capable of securing each module separately. This is accomplished by a unique module support structure, which is formed into the inner walls of the container. These containers may also have impact absorbing cavities formed above and below the module support structure. In a preferred application, the container is constructed of semi-transparent, antistatic plastic. Such a novel arrangement not only makes it possible to inspect the contents of the package, but also provides a certain degree of protection to the contents. Since the contents are visible when the container is closed, the contents of a single container need not be identical. This container may also be reused, which results in cost savings. These containers provide a means for easily storing, handling, and inspecting memory modules, while protecting the modules from electrostatic as well as physical damage.

Accordingly, it is an object of the disclosed invention to provide an improved container for memory modules.

A more detailed explanation of the invention is provided in the following description and claims, and is illustrated in the accompanying drawings.

DESCRIPTION OF THE PREFERRED EMBODIMENT

Figure 1:
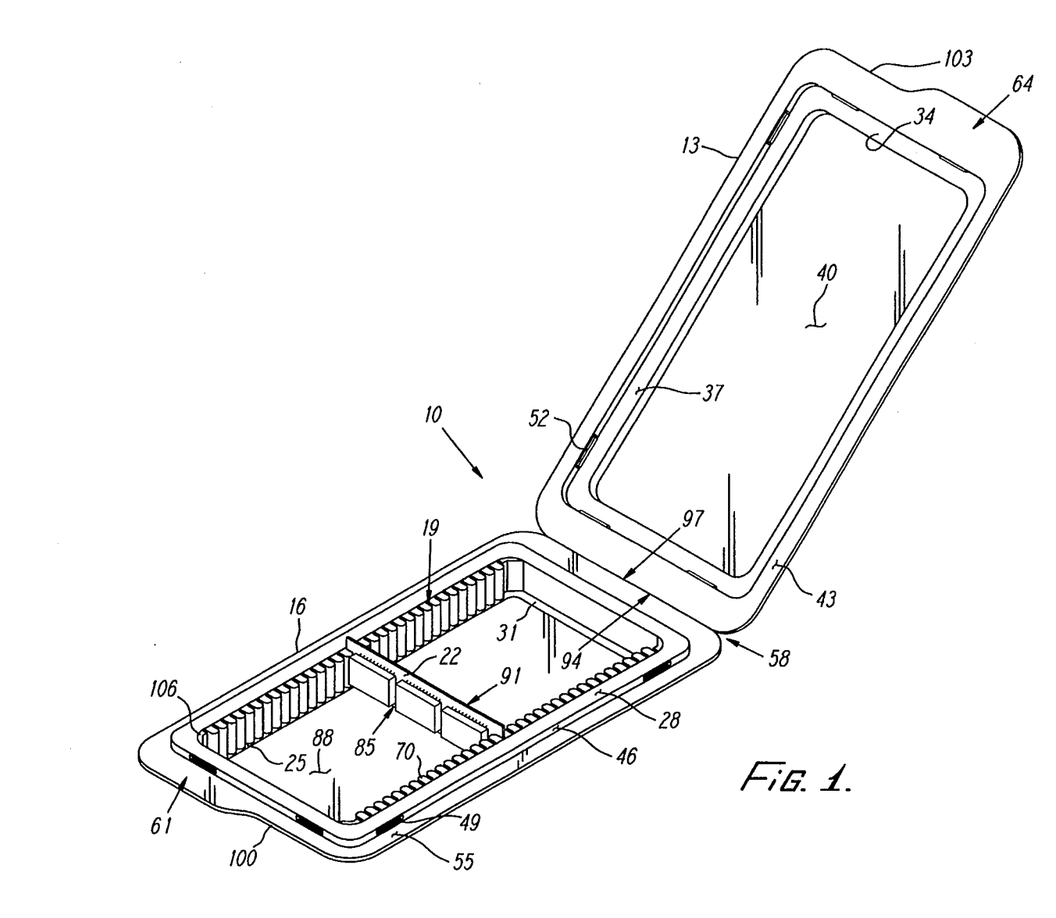
FIG. 1 is a perspective view of a container in accordance with a first embodiment of the present invention, shown with the lid open and one memory module inserted inside the container.
Figure 2:
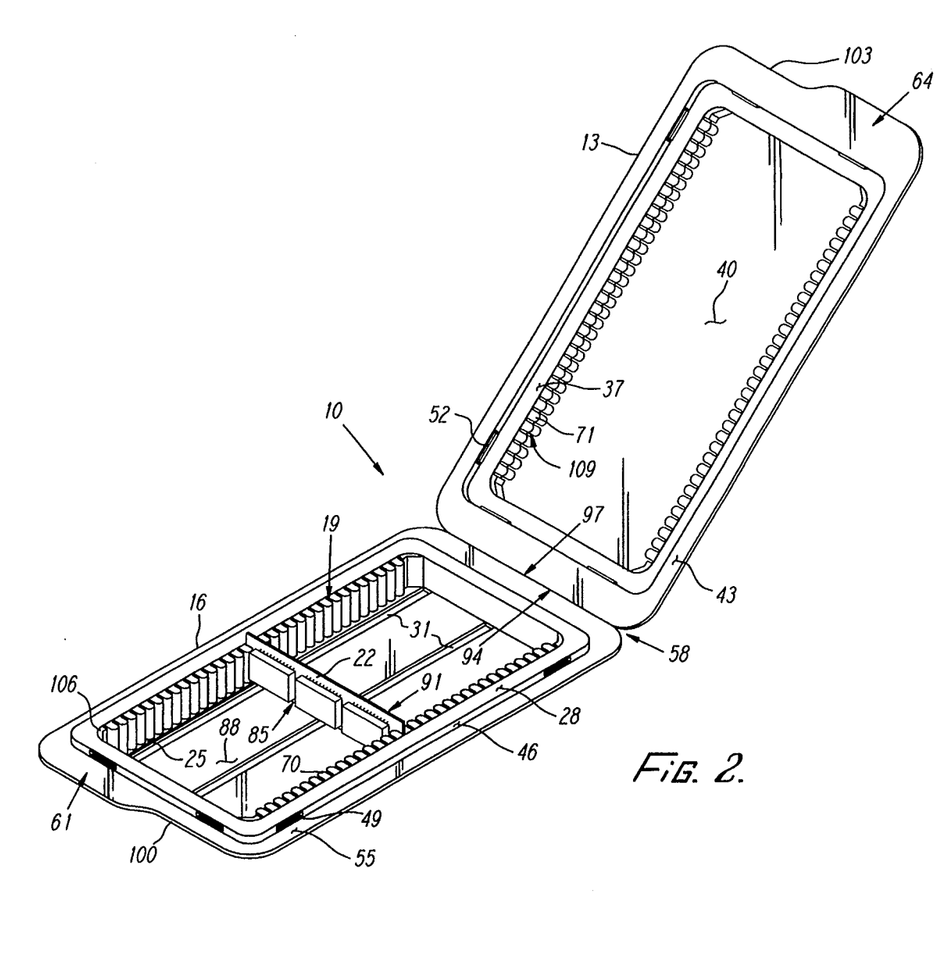
FIG. 2 is a perspective view of a container in accordance with a second embodiment of the present invention, shown with the lid open and one memory module inserted inside the container.
Figure 4:
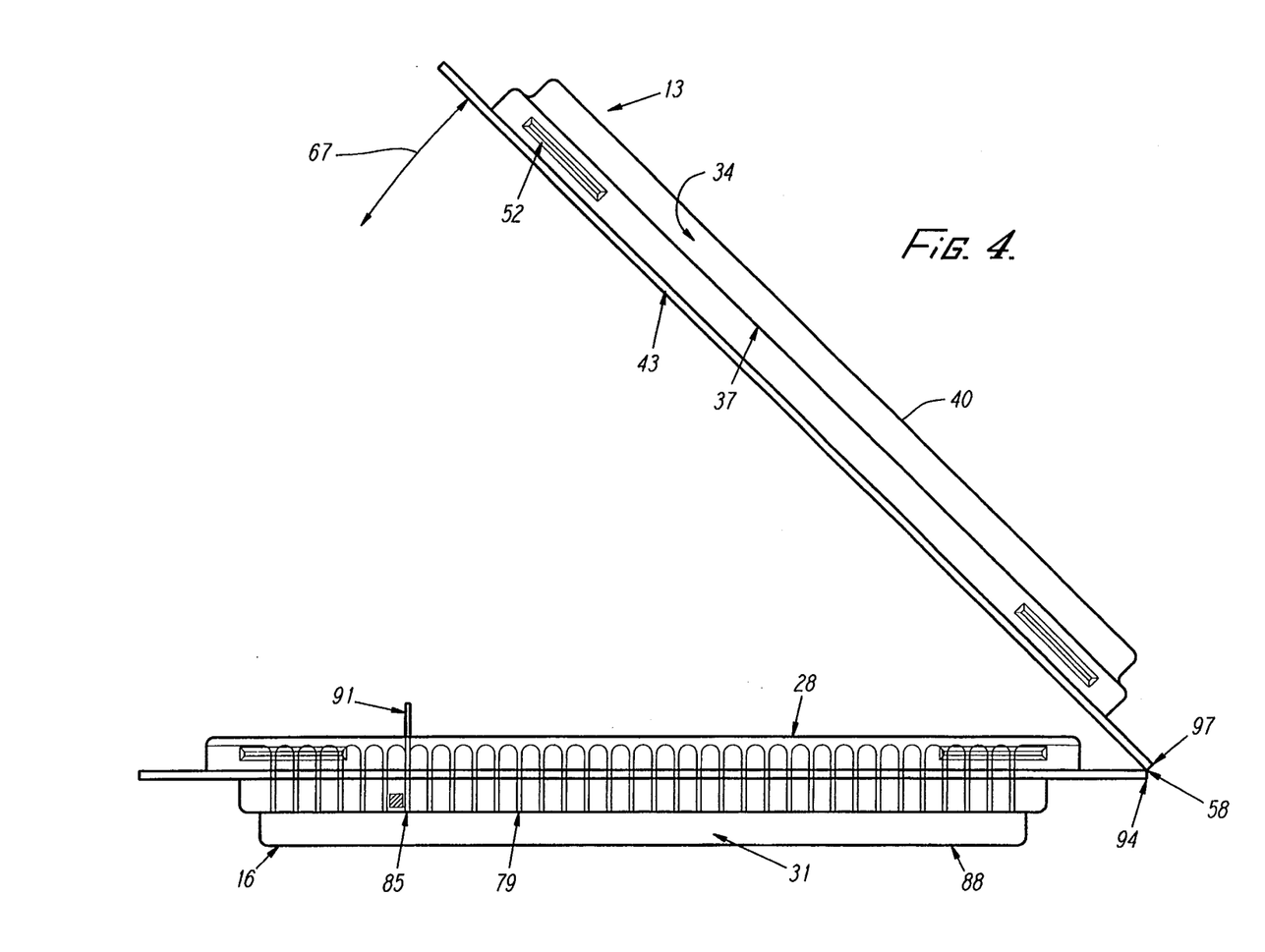
FIG. 4 is a side view of the container of FIG. 1.

A further understanding of the present invention may be had by reference to the following description taken in connection with the accompanying drawings. Referring to FIGS. 1 and 2, two preferred embodiments of a memory module container 10 are represented as being of a one-piece, clam-shell construction. Preferably, the lid 13 and the tray 16 are constructed from a single piece of material. In these preferred embodiments, the material is 0.015 inch thick polyvinyl chloride (PVC) with an antistatic coating. When the lid 13 is opened or closed it follows the path represented by arc 67 in FIG. 4 as the lid 13 rotates around hinge line 58. Hinge line 58 is created by creasing the material between the lid 13 and the tray 16. In this arrangement, the lid 13 and the tray 16 remain connected to each other.

Figure 7:
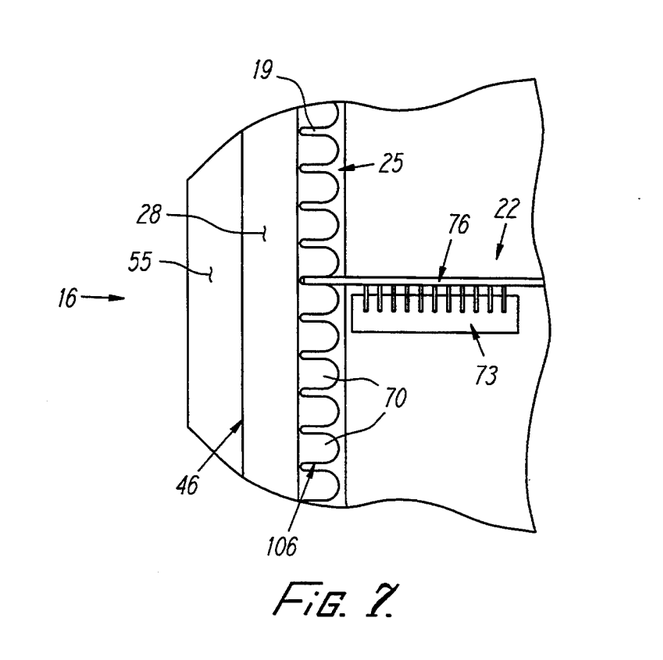
FIG. 7 is an enlarged view of section 7—7 of the container of FIG. 6.

As shown to the best advantage in FIG. 7, there are finger-like tray protrusions 70 formed into the tray inner walls 106, creating vertical slots 19 between adjacent tray protrusions 70. Memory modules 22 are inserted into slots 19, which are spaced apart by a distance equal to the width of a tray protrusion 70. The width of each tray protrusion 70 is at least as large as the height of the components 73 mounted on the printed circuit boards 76 of the modules 22. Depending on the type of components and their resistance to physical damage, the width of the tray protrusions 70 will vary. The slots 19 are approximately the same width as the printed circuit boards 76, such that, when inserted into the container 10, the modules 22 are held substantially free from movement.

Figure 3:
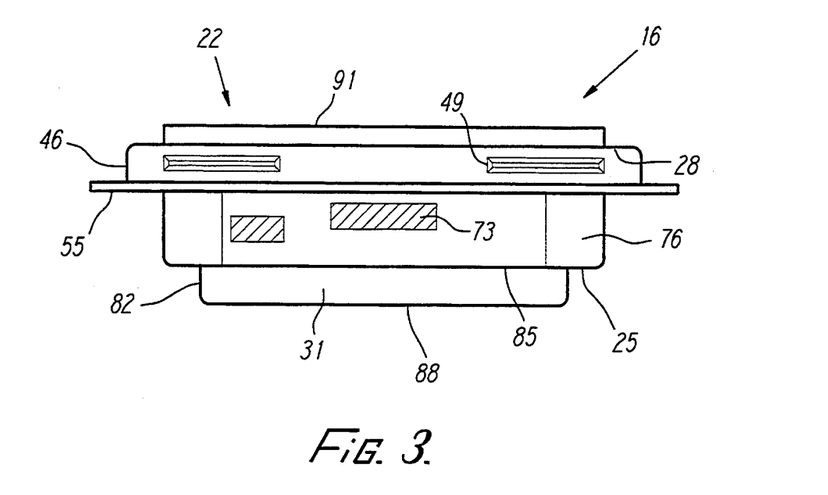
FIG. 3 is a front view of the tray of the container of FIG. 1.
Figure 5:
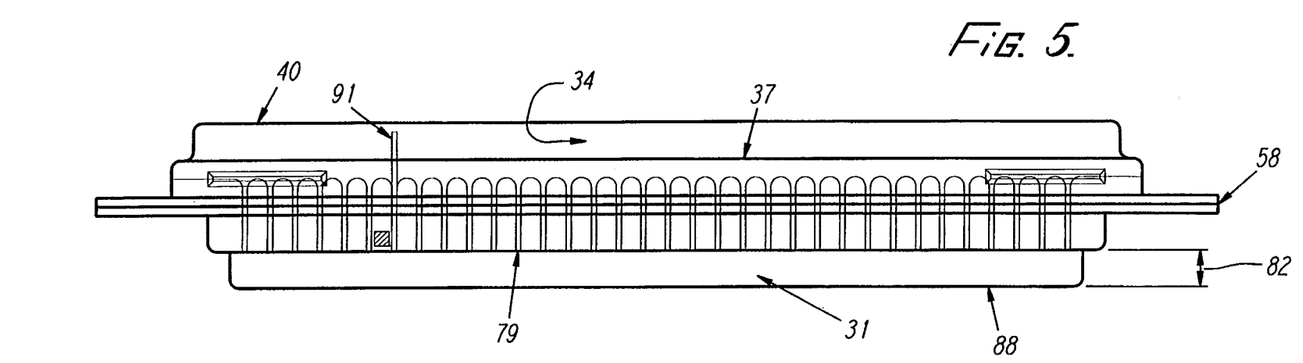
FIG. 5 is a side view of the container of FIG. 1 shown with the lid closed.

At the root 79 (see FIGS. 4 and 5) of the vertical slots 19, a ledge 25 is formed into the tray 16. The ledge 25 extends beyond the tray protrusions 70. Lower edges 85 of the memory modules 22 rest on the ledge 25 after insertion into the slots 19. In this configuration, approximately three-quarters of the width of the modules 22 rest at or below the upper flange 28 of the tray 16 as seen best in FIG. 3. This allows for easy removal of the module 22 from the container 10, while providing sufficient support such that the module stays substantially perpendicular to the ledge 25.

In the preferred embodiment shown in FIG. 1, a lower cavity 31 exists below the modules 22 when they are inserted into the tray 16. The lower cavity 31 has side walls 82 that are preferably 0.25 inches in height, which is the distance between the container base 88 of the tray 16 and the ledge 25. This lower cavity 31 provides a cushioning region or buffer zone, which absorbs some of the shocks and crushing impacts to which the container may be subjected. Since the modules 22 may not touch the container base 88 of the tray 16 in this preferred embodiment, the modules 22 are protected from physical shocks.

In the preferred embodiment shown in FIG. 2, three elongated lower cavities 31 (two of which may be seen in FIG. 2) exist below the modules 22 when they are inserted into the tray 16. The lower cavities 31 in this embodiment are approximately 0.0625 inches deep. As in the preferred embodiment of FIG. 1, these lower cavities 31 provide cushioning regions or buffer zones, which absorbs some of the shocks and crushing impacts to which the container may be subjected. In addition, the elongated cavities 31 increase the structural rigidity of the tray Referring again to the embodiment shown in FIG. 1, a second cavity 34 is formed into the lid 13, which is tiered or stair stepped, with a first surface 37 approximately half way between a second surface 40 of the lid 13 and a lid lip 43, which forms the horizontal surface of the lid 13 that is closest to the tray 16. In this preferred embodiment, the second surface 40 and the first surface 37 are displaced approximately 0.3 inches from each other. When the lid 13 is closed, the first surface 37 abuts upper flange 28 of the tray 16 around the entire circumference of the upper flange 28. As can be seen to the best advantage in FIG. 5, when the lid 13 is closed, the upper edges 91 of the modules 22 do not touch the second surface 40 of the lid 13 in this preferred embodiment. The distance between the first surface 37 and the second surface 40 may be greater than the approximately one-quarter of the width of the modules 22 that protrudes into the second cavity 34 formed between the first surface 37 and the second surface 40 of the lid 13. Therefore, a small portion of the second cavity 34 may be able to absorb some physical shocks or impacts that may be applied to the second surface 40 and thereby may provide a certain amount of protection to the modules 22.

As an alternative to the smooth cavity 34 formed in the lid 13 of the embodiment shown in FIG. 1, FIG. 2 shows an embodiment wherein there are finger-like lid protrusions 71 formed into the lid inner walls 109, much like the tray protrusions 70, which may be seen to best advantage in FIG. 7. The lid 13 of the embodiment of FIG. 2 is tiered or stair stepped like the embodiment of FIG. 1, with a first surface 37 between a second surface 40 of the lid 13 and a lid lip 43, which again forms the horizontal surface of the lid 13 that is closest to the tray 16. In this preferred embodiment, the second surface 40 and the first surface 37 are displaced from each other a distance that is approximately equal to or slightly greater than the approximately one quarter of the width of the modules 22 that protrudes into the lid 13. As in the embodiment depicted in FIG. 1, when the lid 13 is closed, the first surface 37 abuts the upper flange 28 of the tray 16 around the entire circumference of the upper flange 28.

Above and behind the slots 19, a wall 46 is formed into the tray 16. The wall 46 connects the upper flange 28 to the tray lip 55. In this preferred embodiment, the wall 46 is approximately 0.2 inches in height. The upper flange 28 is preferably 0.2 inches wide. The wall 46 helps align the lid 13 as the lid 13 is closed and increases the rigidity of the tray 16. In addition, eight indentations 49 are formed into the wall 46 at least adjacent to each corner of the container 10.

Figure 8:
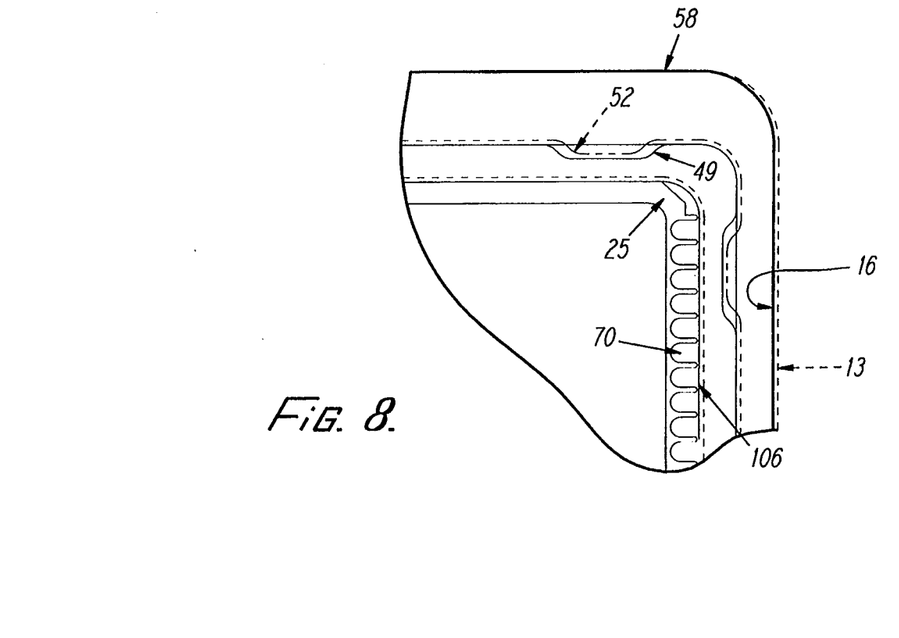
FIG. 8 is an enlarged view of section 8—8 of the container of FIG. 6.

One corner of container 10 is depicted in FIG. 8, which shows two indentations 49 in the tray 16. These indentions 49 are one-tenth of an inch deep by three-quarters of an inch long in this preferred embodiment. The lid 13 has eight extruded ridges 52 formed into it at positions that correspond to the eight indentations 49 in the tray 16. Two of these extruded ridges 52 are shown in FIG. 8 as they appear when the lid 13 is closed. In FIG. 8, the lid 13 is shown in phantom and the tray 16 is shown with solid lines. This was done to make it easier to distinguish parts of the lid 13 from parts of the tray 16. Since the container 10 is transparent in this preferred embodiment, it is possible to see both the lid 13 and the tray 16 simultaneously. Therefore, the phantom lines were used in FIG. 8 merely to aid comprehension and not in the usual sense to represent hidden components.

A latch releasably holds the container closed. In the preferred embodiments, when the lid 13 is closed, the extruded ridges 52 "snap" into the indentations 49, and the lid 13 is latched securely over the tray 16. Unless purposely opened, the container 10 remains closed, thus providing a secure container for the memory modules 22. The latch, comprising the indentations 49 and the extruded ridges 52, is an integral part of the container 10 in the preferred embodiments, which saves space, weight, material, and cost.

Around the circumference of the exterior portion of the base of wall 46 is a tray lip 55, which is approximately 0.25 inch wide in this preferred embodiment. This tray lip 55 serves as the outer rim on the tray 16 and increases the rigidity of container 10.

The lid 13 and the tray 16 are formed in one piece in which a first back edge 94 of the tray lip 55 is connected to a second back edge 97 of the lid lip 43. At this connection point, a hinge line 58 is created by creasing the plastic, making the container 10 easier to close. This integrated hinge 58 requires no additional parts, which results in further cost savings.

Along a first front edge 100 of the tray lip 55, there is a tray tab 61. Similarly, along a second front edge 103 of the lid lip 43, there is a lid tab 64. These tabs 61, 64 are intentionally misaligned (as can be seen to best advantage in FIG. 6) to facilitate easy opening and closing of the container 10. The misaligned tabs 61, 64 may be readily grasped by a person to open the container 10.

Figure 6:
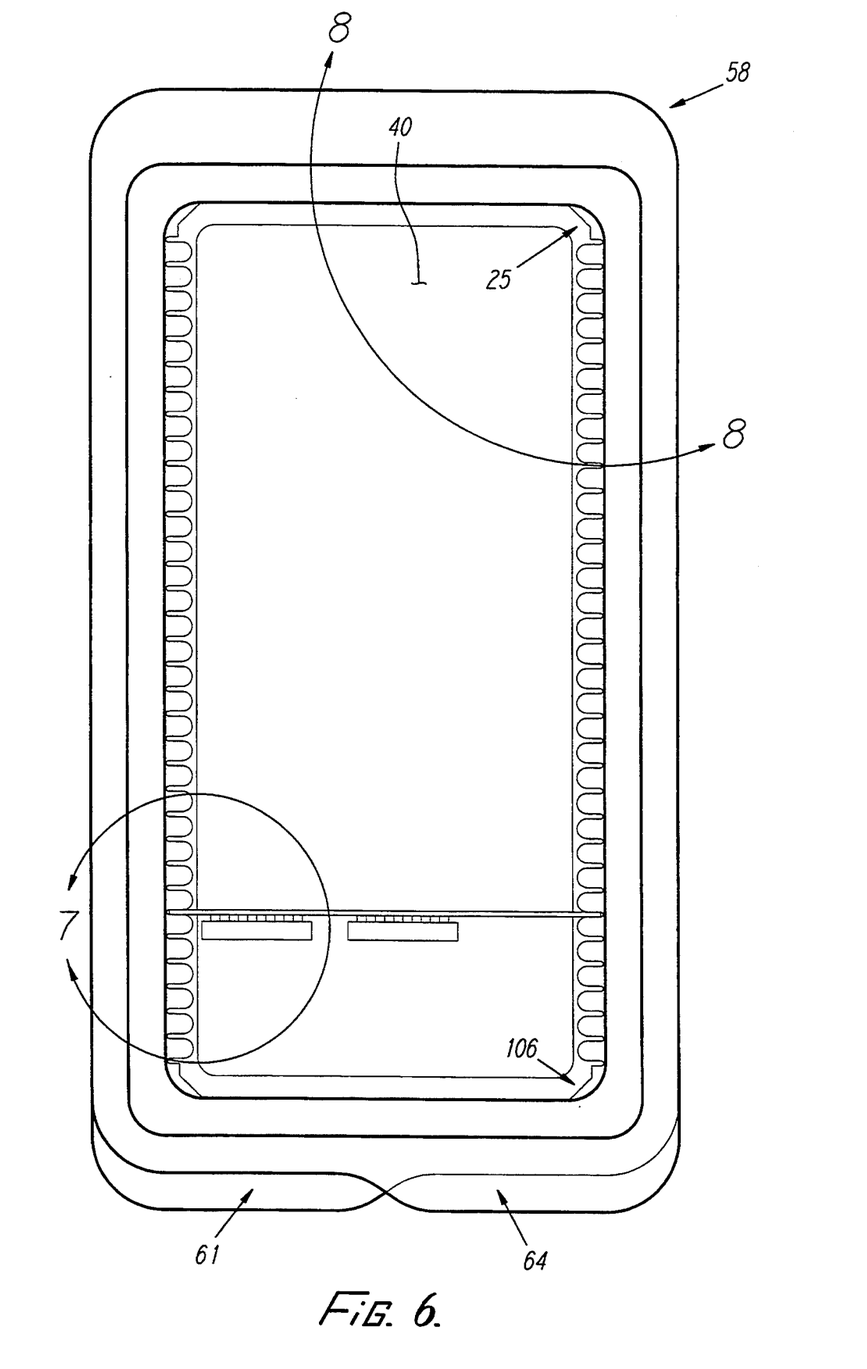
FIG. 6 is a top view of the container of FIG. 4 showing a sample of the type of information that may be formed into the lid.

The lid 13 of this preferred embodiment is formed from PVC, which may be formed with pertinent information. FIG. 6 depicts an example of the type of information that may be formed into the lid 13. This information may include, for example, the type of modules, proper uses for the modules, the manufacturer of the modules, the quantity of modules, module handling precautions, the patent number, or warnings. Although standard glued labels may be used with this container, forming information directly into the lid 13 saves labels and extra procedures.

While what has been described above are preferred embodiments of this invention, it will be obvious to those skilled in the art that numerous changes may be made without departing from the spirit or scope of the invention. It is intended that all matter contained in the above description or shown in the accompanying drawing shall be interpreted as being illustrative only and not limiting. The invention therefore is not to be limited except in accordance with the below claims.

I claim:

1. A container for memory modules comprising
a stair-stepped lid comprising a substantially horizontal first surface, a substantially horizontal second surface, and a substantially horizontal lid lip, said first surface being between said second surface and said lid lip;
a tray comprising a first tray inner wall, a second tray inner wall, and at least one pair of tray protrusions, wherein said at least one pair of tray protrusions is formed into said first tray inner wall and said at least one pair of tray protrusions forms a slot between said tray protrusions, wherein the slot has a width that is substantially equal to a width of a printed circuit board, and wherein a width of each of said tray protrusions is equal to or greater than a height of the memory modules, each of said tray protrusions being aligned with like tray protrusions on said second tray inner wall, the tray also comprising a tray lip that abuts the lid lip when the container is closed, said tray further comprising an upper flange which abuts said first surface of said lid when the container is closed, said tray still further comprising a lower cavity, a ledge at a root of said tray protrusions for supporting the memory modules, and a container base, wherein said lower cavity is formed between said ledge at said root of said tray protrusions and said container base, wherein said lid and said tray are pivotally connected along one edge by a hinge means; and
a latch for keeping the container releasably closed.

2. A container according to claim 1 wherein said lid, tray, and hinge means are formed from a single piece of polyvinyl chloride.

3. A container for memory modules comprising
a stair-stepped lid comprising a substantially horizontal first surface, a substantially horizontal second surface, and a substantially horizontal lid lip, said first surface being between said second surface and said lid lip;
a tray comprising a first tray inner wall, a second tray inner wall, and at least one pair of tray protrusions, wherein said at least one pair of tray protrusions is formed into said first tray inner wall and said at least one pair of tray protrusions forms a slot between said tray protrusions, wherein the slot has a width that is substantially equal to a width of a printed circuit board, and wherein a width of each of said tray protrusions is equal to or greater than a height of the memory modules, each of said tray protrusions being aligned with like tray protrusions on said second tray inner wall, the tray also comprising a tray lip that abuts the lid lip when the container is closed, said tray further comprising an upper flange which abuts said first surface of said lid when the container is closed, said tray still further comprising a lower cavity, a ledge at a root of said tray protrusions for supporting the memory modules, and a container base, wherein said lower cavity is formed between said ledge at said root of said tray protrusions and said container base; and
a latch for keeping the container releasably closed, wherein said latch comprises at least one indentation and a corresponding at least one ridge, and wherein said at least one indentation is formed into said tray and said at least one ridge is formed into said lid, such that, when said lid is closed, said ridges fit into said indentations.

4. A container according to claim 3 wherein said at least one indentation is formed into said lid and said at least one ridge is formed into said tray.

5. A container for memory modules comprising
a stair-stepped lid comprising a substantially horizontal first surface, a substantially horizontal second surface, and a substantially horizontal lid lip, said first surface being between said second surface and said lid lip;
a tray comprising a first tray inner wall, a second tray inner wall, and at least one pair of tray protrusions, wherein said at least one pair of tray protrusions is formed into said first tray inner wall and said at least one pair of tray protrusions forms a slot between said tray protrusions, wherein the slot has a width that is substantially equal to a width of a printed circuit board, and wherein a width of each of said tray protrusions is equal to or greater than a height of the memory modules, each of said tray protrusions being aligned with like tray protrusions on said second tray inner wall, the tray also comprising a tray lip that abuts the lid lip when the container is closed, said tray further comprising an upper flange which abuts said first surface of said lid when the container is closed, said tray still further comprising a lower cavity, a ledge at a root of said tray protrusions for supporting the memory modules, and a container base, wherein said lower cavity is formed between said ledge at said root of said tray protrusions and said container base; and a latch for keeping the container releasably closed, wherein said lid comprises a lid tab extending therefrom and said tray comprises a tray tab extending therefrom, said lid tab and said tray tab being offset at one end to facilitate opening the container.

* * * * *